United States Patent
Romano et al.

(10) Patent No.: US 9,006,800 B2
(45) Date of Patent: *Apr. 14, 2015

(54) INGAN OHMIC SOURCE CONTACTS FOR VERTICAL POWER DEVICES

(75) Inventors: Linda Romano, Sunnyvale, CA (US); Andrew Edwards, San Jose, CA (US); Dave P. Bour, Cupertino, CA (US); Isik C. Kizilyalli, San Francisco, CA (US)

(73) Assignee: Avogy, Inc., San Jose, CA (US)

( * ) Notice: Subject to any disclaimer, the term of this patent is extended or adjusted under 35 U.S.C. 154(b) by 281 days.

This patent is subject to a terminal disclaimer.

(21) Appl. No.: 13/326,192

(22) Filed: Dec. 14, 2011

(65) Prior Publication Data

US 2013/0153917 A1 Jun. 20, 2013

(51) Int. Cl.
| | |
|---|---|
| H01L 29/66 | (2006.01) |
| H01L 29/20 | (2006.01) |
| H01L 29/201 | (2006.01) |
| H01L 29/205 | (2006.01) |
| H01L 29/45 | (2006.01) |
| H01L 29/808 | (2006.01) |
| H01L 29/10 | (2006.01) |

(52) U.S. Cl.
CPC ......... *H01L 29/2003* (2013.01); *H01L 29/1066* (2013.01); *H01L 29/201* (2013.01); *H01L 29/205* (2013.01); *H01L 29/452* (2013.01); *H01L 29/66924* (2013.01); *H01L 29/8083* (2013.01)

(58) Field of Classification Search
CPC .................. H01L 29/66431; H01L 29/66462; H01L 29/66893
USPC .......... 438/192; 257/263, 261, 134, 135, 136
See application file for complete search history.

(56) References Cited

U.S. PATENT DOCUMENTS

| | | | |
|---|---|---|---|
| 6,864,510 B2 * | 3/2005 | Youn et al. | ...................... 257/81 |
| 6,870,189 B1 | 3/2005 | Harada et al. | |

(Continued)

FOREIGN PATENT DOCUMENTS

| | | |
|---|---|---|
| EP | 2346068 A1 | 7/2011 |
| WO | 2013/020051 A1 | 2/2013 |
| WO | 2013/020061 A1 | 2/2013 |

OTHER PUBLICATIONS

Non-Final Office Action for U.S. Appl. No. 13/198,655 mailed on Aug. 16, 2013.

(Continued)

*Primary Examiner* — Yu-Hsi D Sun
(74) *Attorney, Agent, or Firm* — Kilpatrick Townsend & Stockton LLP

(57) ABSTRACT

A vertical III-nitride field effect transistor includes a drain comprising a first III-nitride material, a drain contact electrically coupled to the drain, and a drift region comprising a second III-nitride material coupled to the drain and disposed adjacent to the drain along a vertical direction. The field effect transistor also includes a channel region comprising a third III-nitride material coupled to the drift region, a gate region at least partially surrounding the channel region, and a gate contact electrically coupled to the gate region. The field effect transistor further includes a source coupled to the channel region. The source includes a GaN-layer coupled to an InGaN layer. The channel region is disposed between the drain and the source along the vertical direction such that current flow during operation of the vertical III-nitride field effect transistor is along the vertical direction.

7 Claims, 11 Drawing Sheets

(56) References Cited

U.S. PATENT DOCUMENTS

| | | | |
|---|---|---|---|
| 7,355,223 B2 * | 4/2008 | Harris et al. | 257/256 |
| 7,439,595 B2 | 10/2008 | Ueda | |
| 7,479,672 B2 | 1/2009 | Zhao | |
| 7,719,055 B1 | 5/2010 | McNutt et al. | |
| 7,750,377 B2 | 7/2010 | Hoshino et al. | |
| 7,923,320 B2 | 4/2011 | Ryu | |
| 2004/0124435 A1 | 7/2004 | D'Evelyn et al. | |
| 2005/0067630 A1 | 3/2005 | Zhao | |
| 2007/0096145 A1 * | 5/2007 | Watanabe | 257/134 |
| 2008/0142811 A1 | 6/2008 | Matocha et al. | |
| 2008/0176366 A1 | 7/2008 | Mita et al. | |
| 2009/0057684 A1 | 3/2009 | Otake et al. | |
| 2010/0097105 A1 | 4/2010 | Morita et al. | |
| 2011/0020991 A1 | 1/2011 | Sheridan et al. | |
| 2013/0032812 A1 | 2/2013 | Kizilyalli et al. | |

OTHER PUBLICATIONS

Notification of Transmittal of The International Search Report and The Written Opinion of The International Searching Authority, or The Declaration and International Search Report and Written Opinion of The International Searching Authority for International Application No. PCT/US2012/049520 mailed on Oct. 4, 2012, 11 pages.

Notification of Transmittal of The International Search Report and The Written Opinion of The International Searching Authority, or The Declaration and International Search Report and Written Opinion of The International Searching Authority for International Application No. PCT/US2012/049549 mailed on Oct. 25, 2012, 12 pages.

U.S. Appl. No. 13/198,659, filed by Isik C. Kizilyalli, et al on Aug. 4, 2011.

* cited by examiner

INGAN OHMIC SOURCE CONTACTS FOR VERTICAL POWER DEVICES

BACKGROUND

Power electronics are widely used in a variety of applications. Power electronic devices are commonly used in circuits to modify the form of electrical energy, for example, from ac to dc, from one voltage level to another, or in some other way. Such devices can operate over a wide range of power levels, from milliwatts in mobile devices to hundreds of megawatts in a high voltage power transmission system. Despite the progress made in power electronics, there is a need in the art for improved electronics systems and methods of operating the same.

SUMMARY OF THE INVENTION

The present invention relates generally to electronic devices. More specifically, the present invention relates to forming ohmic contacts for high power devices, including high power field-effect transistors. Merely by way of example, the invention has been applied to electronic power devices utilizing Indium Gallium Nitride (InGaN) in the source region to reduce barrier height, reduce strain on the device, and provide for better tunneling performance. The methods and techniques can be applied to a variety of compound semiconductor systems including junction FETs, high electron mobility transistors, thyristors, or the like.

Some embodiments of the present invention provide a method for fabricating a vertical power device. The method includes providing a III-nitride substrate and forming a first III-nitride epitaxial layer coupled to the III-nitride substrate. In one embodiment, the first III-nitride epitaxial layer is characterized by a first dopant concentration. The method further includes forming a second III-nitride epitaxial layer coupled to the first III-nitride epitaxial layer in which the second III-nitride epitaxial layer has a second dopant concentration of the same type and less than or equal to the first dopant concentration. The method additionally includes forming a multilayered structure coupled to the second III-nitride epitaxial layer where the multilayered structure includes a third III-nitride epitaxial layer and an indium gallium nitride (InGaN) layer having a third dopant concentration of the same type and greater than the first dopant concentration. The method further includes removing at least a portion of the multilayered structure and at least a portion of the second III-nitride epitaxial layer to form a channel region of the second III-nitride epitaxial layer, forming an epitaxial layer of an opposite type from the first III-nitride epitaxial layer coupled to the channel region, forming a first metallic structure electrically coupled to the III-nitride substrate, forming a second metallic structure electrically coupled to the epitaxial layer of the opposite type, and finally forming a third metallic structure electrically coupled to the multilayered structure.

Some embodiments of the present invention provide a method for fabricating an epitaxial structure that includes providing a III-nitride substrate and forming a first III-nitride epitaxial layer of a first conductivity type coupled to the III-nitride substrate. The first III-nitride epitaxial layer has a first dopant concentration. The method further includes forming a second III-nitride epitaxial layer of the first conductivity type coupled to the first III-nitride epitaxial layer in which the second III-nitride epitaxial layer has a second dopant concentration. Thereafter the method includes forming a third III-nitride layer of the first conductivity type coupled to the second III-nitride epitaxial layer in which the third III-nitride layer has a third dopant concentration greater than the first dopant concentration, and then the method includes forming an indium gallium nitride (InGaN) layer coupled to the third III-nitride layer in which a percentage of indium in the InGaN layer is at least 20%.

Some embodiments of the present invention provide a power device. The power device includes a drain fabricated from a first III-nitride material, a drain contact electrically coupled to the drain, and a drift region comprising a second III-nitride material coupled to the drain and disposed adjacent to the drain along a vertical direction. The power device further includes a channel region comprising a third III-nitride material coupled to the drift region, a gate region at least partially surrounding the channel region, and a gate contact electrically coupled to the gate region. Additionally, the power device also includes a source coupled to the channel region. The source comprises (i) a gallium nitride layer and (ii) an indium gallium nitride (InGaN) layer coupled to the gallium nitride layer. The power device also includes a source contact electrically coupled to the source. The channel region of the power device is disposed between the drain and the source along the vertical direction such that current flow during operation of the power device is along the vertical direction.

DETAILED DESCRIPTION OF SPECIFIC EMBODIMENTS

Figure 1A:
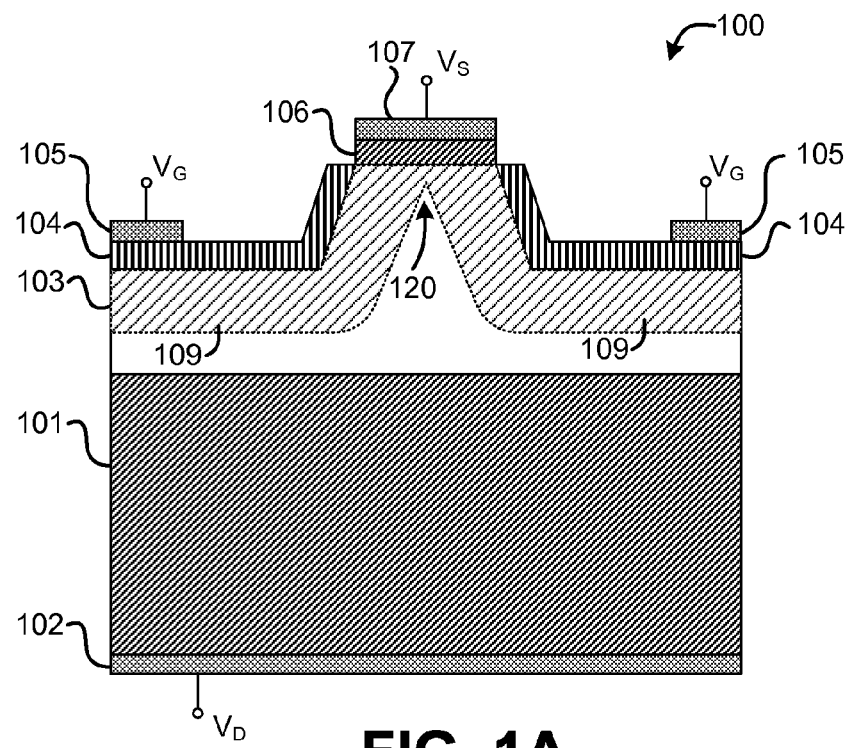
FIGS. 1A-1B are simplified cross-sectional diagrams illustrating the operational functionality of a vertical power device according to an embodiment of the present invention.

Embodiments of the present invention relate to electronic devices. More specifically, the present invention relates to forming ohmic contacts for high power devices, including high power field-effect transistors. Merely by way of example, the invention has been applied to electronic devices utilizing Indium Gallium Nitride based contacts to reduce barrier height, reduce strain on the device, and provide for better tunneling performance. The methods and techniques can be applied to a variety of compound semiconductor systems including junction FETs, high electron mobility transistors, diodes, thyristors, or the like.

GaN-based electronic and optoelectronic devices are undergoing rapid development. Desirable properties associated with GaN and related alloys and heterostructures include high bandgap energy for visible and ultraviolet light emission, favorable transport properties (e.g., high electron mobility and saturation velocity), a high breakdown field, and high thermal conductivity. According to embodiments of the present invention, gallium nitride (GaN) epitaxy on bulk or pseudo-bulk GaN substrates is utilized to fabricate vertical GaN-based semiconductor devices not possible using conventional techniques. For example, conventional methods of growing GaN include using a foreign substrate such as silicon carbide (SiC). This can limit the thickness of a usable GaN layer grown on the foreign substrate due to differences in thermal expansion coefficients and lattice constant between the GaN layer and the foreign substrate. High defect densities at the interface between GaN and the foreign substrate further complicate attempts to create vertical devices, including power electronic devices such as JFETs and other field-effect transistors.

Homoepitaxial GaN layers on bulk GaN substrates, on the other hand, are utilized in the embodiments described herein to provide superior properties to conventional techniques and devices. For instance, electron mobility, μ, is higher for a given background doping level, N. This provides low resistivity, ρ, because resistivity is inversely proportional to electron mobility, as provided by equation (1):

$$\rho = \frac{1}{q\mu N}, \quad (1)$$

where q is the elementary charge.

Another superior property provided by homoepitaxial GaN layers on bulk GaN substrates is high critical electric field for avalanche breakdown. A high critical electric field allows a larger voltage to be supported over smaller length, L, than a material with a lower critical electric field. A smaller length for current to flow together with low resistivity give rise to a lower resistance, R, than other materials, since resistance can be determined by the equation:

$$R = \frac{\rho L}{A}, \quad (2)$$

where A is the cross-sectional area of the channel or current path.

In general, a tradeoff exists between the physical dimension of a device needed to support high voltage in a device's off-state and the ability to pass current through the same device with low resistance in the on-state. In many cases GaN is preferable over other materials in minimizing this tradeoff and maximizing performance. In addition, GaN layers grown on bulk GaN substrates have low defect density compared to layers grown on mismatched substrates. The low defect density will give rise to superior thermal conductivity, less trap-related effects such as dynamic on-resistance, and better reliability.

Among the vertical device structures provided by embodiments of the present invention is a vertical JFET. Depending on doping levels, physical dimensions, conductivity type (e.g., n-type or p-type materials), and other factors, vertical JFETs can be designed to have normally-off or normally-on functionality. A normally-off vertical JFET is particularly useful due to its ability to prevent current flow if no voltage is applied to the gate, which can serve as, among other things, a safety feature for vertical JFETs used in power applications.

A normally-off vertical JFET can be created in various ways. For example, an n-type current path from source to drain can be gated on either side by p+ gates. With sufficiently low background doping, and high positive charge due to high hole concentration in the p+ gates, the channel can be depleted of carriers, or pinched off at zero bias. When a positive voltage is applied to the gate(s), the channel can be re-opened to turn the device on. Thus, in embodiments of the present invention, the vertical JFET is referred to as a vertical junction field effect transistor since the current flows vertically between the source and drain through the gated region.

In addition to the ability to better support applications requiring high-voltage blocking and low on-state resistance, the GaN vertical JFETs described herein can differ from traditional vertical JFETs in other ways. For example, other semiconductors such as SiC or Si can be utilized to manufacture vertical JFETs, altering the mode of manufacture. In addition, the use of GaN epitaxial layers can allow for non-uniform dopant concentrations as a function of thickness within the various layers of the vertical JFET, which can optimize the performance of the device.

Figure 1B:
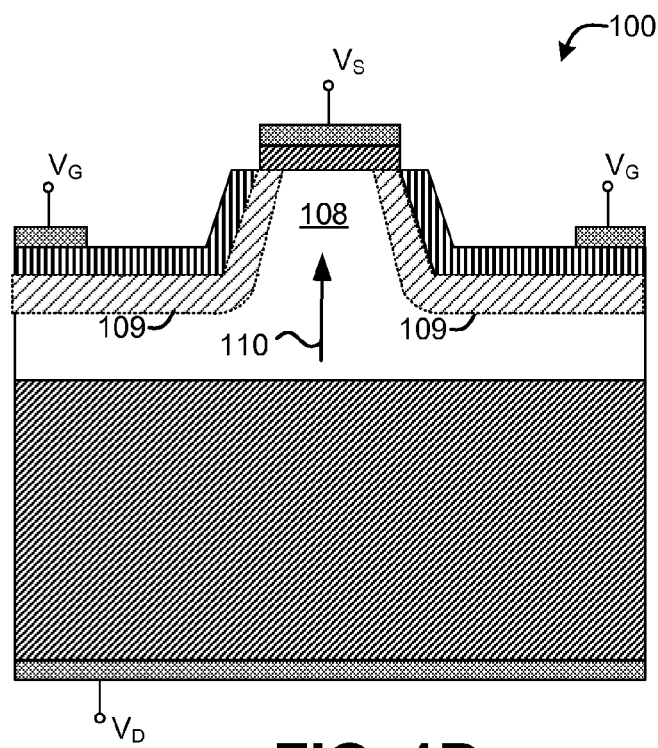

FIGS. 1A-1B are simplified cross-sectional diagrams illustrating the operational functionality of a vertical JFET 100 according to an embodiment of the present invention. Referring to FIG. 1A, a drain 101 is provided. According to the embodiment of the present invention illustrated in FIG. 1A, the substrate is an n-type GaN substrate, but the present invention is not limited to this particular material. In other embodiments, substrates with p-type doping are utilized. Additionally, although a GaN substrate is illustrated in FIG. 1A, embodiments of the present invention are not limited to GaN substrates. Other III-V materials, in particular, III-nitride materials, are included within the scope of the present invention and can be substituted not only for the illustrated GaN substrate, but also for other GaN-based layers and structures described herein. As examples, binary III-V (e.g., III-nitride) materials, ternary III-V (e.g., III-nitride) materials such as InGaN and AlGaN, and quaternary III-V (e.g., III-nitride) materials such as AlInGaN are included within the scope of the present invention. Additionally, embodiments can use materials having an opposite conductivity type to provide devices with different functionality. For example, embodiments provided herein focus on the formation of a JFET with an n-type drain and channel regions. However, a p-type JFET can be formed by using materials with opposite conductivity (e.g., substituting p-type materials for n-type materials, and vice versa) in a similar manner as will be evident to one of skill in the art.

Coupled to the drain 101, is a drift region 103 of n-type GaN material. The drift region 103 provides a medium through which current can flow in the device's on-state in a vertical direction from the drain through a channel region 108 coupled to the drift region 103. In the off-state, the drift region provides a medium for supporting the electric field created by the voltage gradient between the source or gate and the drain. The channel region 108 also can comprise an n-type GaN material that is as wide as possible to minimize added resistance when the vertical JFET 100 is turned on, but narrow enough to provide adequate current pinch off when the vertical JFET 100 is turned off. The channel region 108 is coupled to a source 106 comprising a heavily-doped n-type GaN material.

At least partially surrounding the channel region 108 is p-type GaN material forming a gate 104 region, which can be coupled to at least a portion of the drift region 103 as shown. The p-type GaN material of the gate 104 and the n-type materials of the channel region 108 and drift region 103 form a p-n junction with corresponding depletion regions 109. Finally, contacts 102, 105, and 107, formed from one or more layers of electrical conductors including a variety of metals can be provided on the drain 101, gate 104, and source 106, respectively, to electrically couple the vertical JFET 100 to an electrical circuit (not illustrated).

The operation of the vertical JFET 100 is described as follows. FIG. 1A shows the vertical JFET turned off, which can be a default mode of operation. As illustrated in FIG. 1A, the depletion regions 109 overlap at location 120 in the channel, preventing current flow through the channel region from the drain 101 to the source 106.

FIG. 1B shows the vertical JFET turned on, meaning the depletion regions 109 are separated, allowing current to flow in a vertical direction 110 from the drain 101 through the drift region 103 and channel region 108 to the source 106 when voltages $V_D$ and $V_S$ are applied to the drain contact 102 and source contact 107, respectively. In this embodiment, application of a positive voltage $V_G$ applied to the gate 104 turns the vertical JFET on by decreasing the size of the depletion regions 109 and thereby providing a current path through the channel 108.

Whether the vertical JFET 100 is normally-on or normally off can depend on different features of the vertical JFET 100, such as the width of the channel region 108, dopant concentrations in the channel region 108 and the gate 104, and the like. For example, a normally-on vertical JFET can be formed if the channel region is sufficiently wide and/or the dopant concentrations are high enough, in which case the depletion regions 109 may not pinch off the current when voltage $V_G$ applied to the gate 104 is 0 V. The normally-on vertical JFET 100 can be turned off when $V_G$ reaches a negative threshold voltage. Alternatively, for a normally-off vertical JFET, the channel is pinched off when $V_G$ is 0 V, and the normally-off vertical JFET 100 can be turned on when $V_G$ reaches a positive threshold voltage.

FIGS. 2-9 illustrate a process for creating a first type of vertical JFET that utilizes etching of an epitaxial layer to form the channel of the vertical JFET. In some embodiments, this vertical JFET is referred to as a vertical JFET with a regrown gate.

Figure 2:
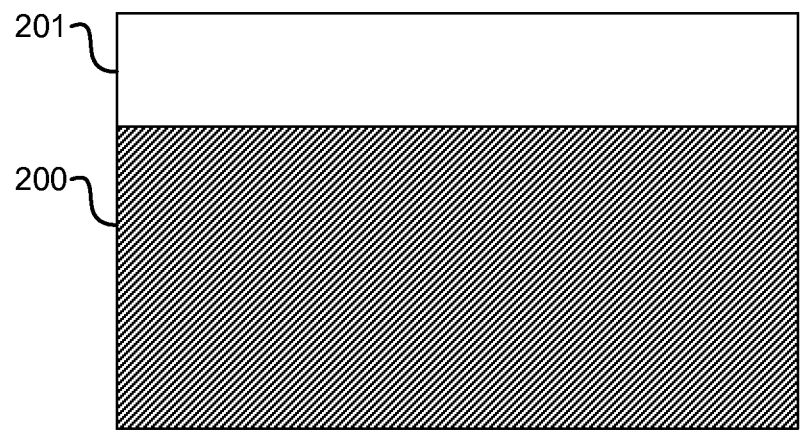
FIGS. 2-9 are simplified cross-sectional diagrams illustrating the fabrication of a vertical power device according to an embodiment of the present invention.

Referring to FIG. 2, a first GaN epitaxial layer 201 is formed on a GaN substrate 200. As indicated above, the GaN substrate 200 can be a bulk or pseudo-bulk GaN material on which the first GaN epitaxial layer 201 is grown. Dopant concentrations (e.g., doping density) of the GaN substrate 200 can vary. For example, a GaN substrate 200 can have an n+ conductivity type, with dopant concentrations ranging from $1 \times 10^{17}$ cm$^{-3}$ to $1 \times 10^{20}$ cm$^{-3}$. Although the GaN substrate 200 is illustrated as including a single material composition, multiple layers can be provided as part of the substrate. Moreover, adhesion, buffer, and other layers (not illustrated) can be utilized during the epitaxial growth process. One of ordinary skill in the art would recognize many variations, modifications, and alternatives.

The properties of the first GaN epitaxial layer 201 can also vary, depending on desired functionality. The first GaN epitaxial layer 201 can serve as a drift region for the vertical JFET 100, and therefore can be a relatively low-doped material. For example, the first GaN epitaxial layer 201 can have an n-conductivity type, with dopant concentrations ranging from $1 \times 10^{14}$ cm$^{-3}$ to $1 \times 10^{18}$ cm$^{-3}$. Furthermore, the dopant concentration can be uniform, or can vary, for example, as a function of the thickness of the drift region.

The thickness of the first GaN epitaxial layer 201 can also vary substantially, depending on the desired functionality. As discussed above, homoepitaxial growth can enable the first GaN epitaxial layer 201 to be grown far thicker than layers formed using conventional methods. In general, in some embodiments, thicknesses can vary between 0.5 μm and 100 μm, for example, thicknesses greater than 5 μm. Resulting breakdown voltages for the vertical JFET 100 can vary depending on the embodiment. Some embodiments provide for breakdown voltages of at least 100V, 300V, 600V, 1.2 kV, 1.7 kV, 3.3 kV, 5.5 kV, 13 kV, or 20 kV.

Different dopants can be used to create n- and p-type GaN epitaxial layers and structures disclosed herein. For example, n-type dopants can include silicon, oxygen, germanium, selenium, tellurium, sulfur, tin, or the like. P-type dopants can include magnesium, beryllium, zinc, or the like.

Figure 3:
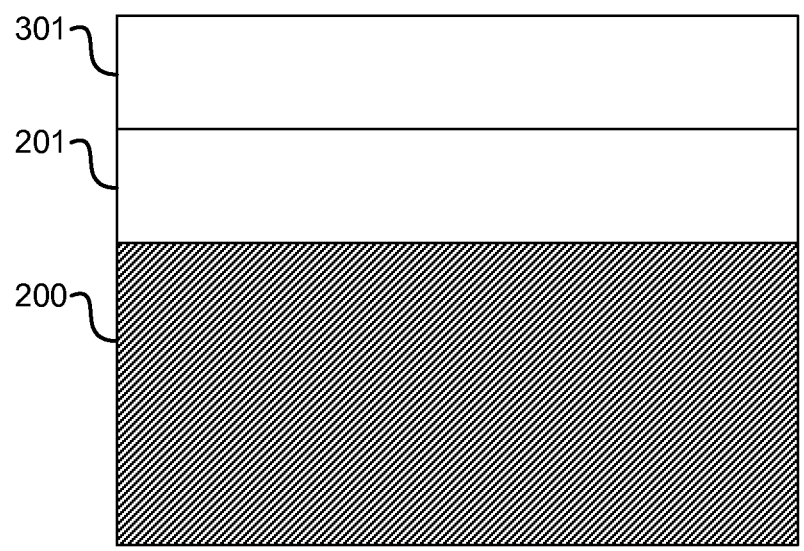

FIG. 3 illustrates the formation of a second GaN epitaxial layer 301 above the first GaN epitaxial layer 201. The second GaN epitaxial layer 301, which eventually comprises the channel of the vertical JFET 100, can have a low dopant concentration. In many embodiments, the dopant concentration of the second GaN epitaxial layer 301 can be equal to or less than the dopant concentration of the first GaN epitaxial layer 201, depending on the desired threshold voltage for the vertical JFET 100. Additionally, the second GaN epitaxial layer 301 can be the same conductivity type as the first GaN epitaxial layer 201. As discussed in relation to the first GaN epitaxial layer 201, and is as applicable to subsequent layers, adhesion layers, buffer layers, and the like, can be utilized during the epitaxial growth as appropriate to the particular device structure fabricated.

The thickness of the second GaN epitaxial layer 301 can also vary depending on the desired functionality. In some embodiments, thicknesses can be between 0.25 μm and 10 μm. In other embodiments, the thickness of the second GaN epitaxial layer 301 can be between 2 μm and 5 μm.

Similar to the first GaN epitaxial layer 201, the dopant concentration of the second GaN epitaxial layer 301 can be uniform or non-uniform. In some embodiments, dopant concentration can vary with the thickness of the second GaN epitaxial layer 301. For example, the dopant concentration in the second GaN epitaxial layer 301 can increase as the distance from the first GaN epitaxial layer 201 increases. In other embodiments, the doping may be modulated between two or more values, or between doped and un-doped regions, resulting in the desired average doping concentration for the layer.

Figure 4:
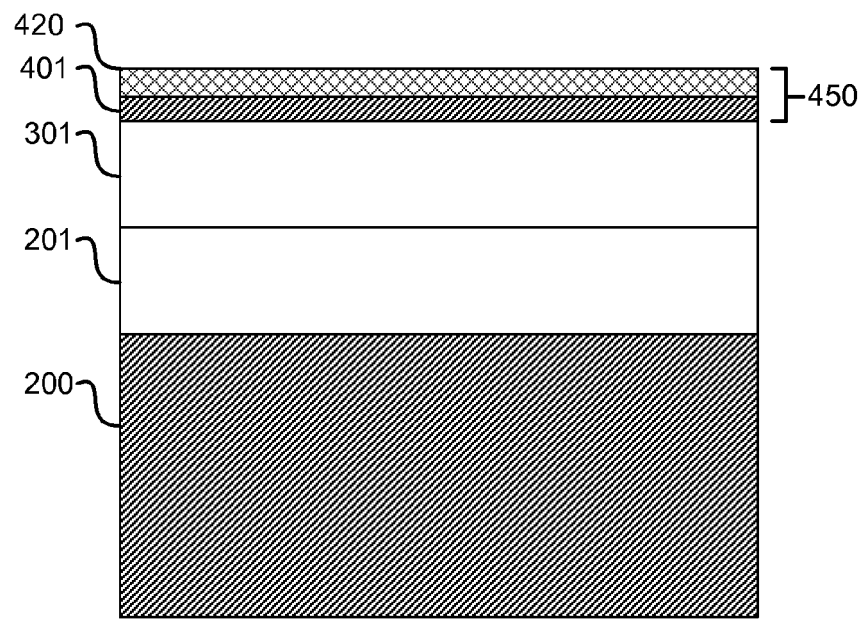

FIG. 4 illustrates the formation of a third GaN epitaxial layer 401 above the second GaN epitaxial layer 301. The third GaN epitaxial layer 401 can be a highly-doped epitaxial layer of the same conductivity type as the first and second GaN epitaxial layers 201, 301. In general, the dopant concentration of the third GaN epitaxial layer 401 can exceed the dopant concentrations of the first and second GaN epitaxial layers 201, 301. For example, an n-type dopant concentration of the third GaN epitaxial layer 401 can be equal to or greater than $1 \times 10^{18}$ cm$^{-3}$. Also illustrated in FIG. 4 is formation of an InGaN layer 420 above third GaN epitaxial layer 401. InGaN layer 420 and third GaN epitaxial layer 401 together form a multilayered structure 450 that can eventually comprise the source of vertical JFET 100. InGaN layer 420 can have the same conductivity as third GaN epitaxial layer 401.

InGaN layer 420 has tunable bandgap that can be beneficial for power devices. The band gap of InGaN layer 420 can be tuned by varying the amount of indium in the InGaN material. In some embodiments, a mole fraction of indium in InGaN layer 420 can be between 5% and 90%. In a particular embodiment, the percentage of indium in InGaN layer 420 is greater than 5%. In some embodiments, the percentage of indium in InGaN layer 420 can range between (a) 5% and 10%, (b) 10% and 20%, (c) 20% and 30%, (d) 30% and 40%, (e) 40% and 50%, (f) 50% and 60%, (g) 60% and 70%, (h) 70% and 80%, or (i) 80% and 90%. The ability to fabricate InGaN layer 420 with such a wide range of possible indium composition percentages provides the ability to adjust the band gap of InGaN layer 420 over a wide range, which is not possible using conventional methods.

The thickness of multilayered structure 450 can impact the contact resistance and current flow properties of the vertical JFET 100. In general, thinner multilayered structure 450 is preferable to a thicker structure. In some embodiments, thicknesses of multilayered structure 450 can be between 10 nm and 1 µm. In a particular embodiment, thickness of multilayered structure 450 is about 200 nm. In other embodiments, the thickness of the third GaN epitaxial layer 401 can be between 5 nm and 100 nm. In some embodiments, thickness of InGaN layer 420 can be between 3 nm and 100 nm. Use of InGaN as the top layer in multilayered structure 450 allows for reduction in contact resistance. The InGaN alloy has a lower bandgap energy and higher electron affinity compared to GaN. Accordingly, the Schottky barrier height between a metal electrode and InGaN surface is reduced relative to GaN. The lower contact resistance contributes to a lower total on-state resistance for the power-electronic devices described herein.

It is desirable that the surface of the source region be as smooth and homogeneous as possible in order to ensure less strain on the source region. Using an InGaN layer helps to minimize the surface degradation of the underlying third GaN epitaxial layer 401. In some embodiments, third GaN epitaxial layer 401 may have surface pitting or degradation as a result of the various processing steps described above. When a metal contact is formed over this GaN layer, the metal contact may have poor quality due to the surface pitting of the under layer 401. InGaN layer 420 formed over third GaN layer 401 can reduce the surface pitting and provide a smoother surface for contact formation. In addition, the indium in InGaN layer 420 is homogeneous because a GaN layer can be homogeneously doped using indium. This helps to provide a better source contact. InGaN layer 420 can be used to effectively adjust the bandgap performance of the source region of the power device.

In addition, InGaN layer 420 may also help reduce the strain in the underlying third GaN layer 401. Bulk GaN films contain a high density of defects, primarily threading dislocations, due to the large lattice mismatch and thermal expansion coefficient difference between the epitaxially grown layers and the substrate. Forming InGaN layer 420 on top of epitaxially grown third GaN layer 401 may help to reduce the strain arising from the lattice and thermal mismatches between the substrate and the epitaxillay grown third GaN layer 401.

Figure 5:
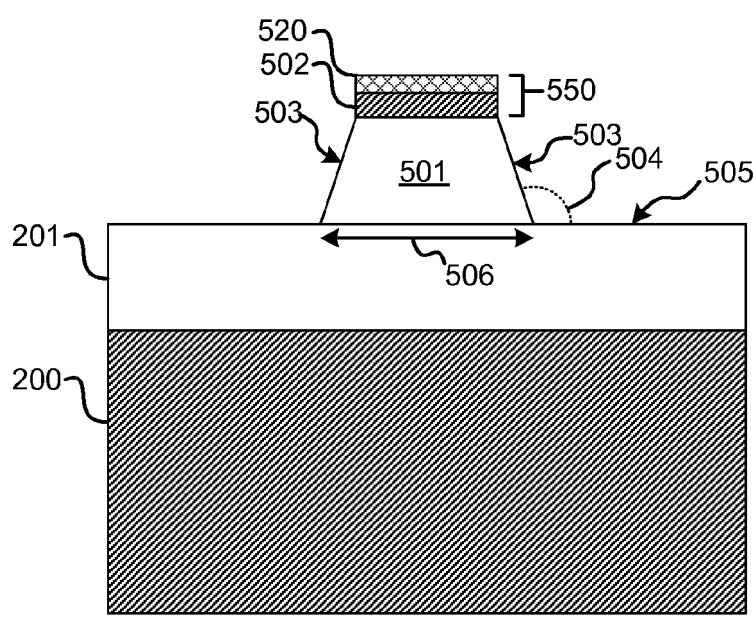

FIG. 5 is a simplified cross-sectional diagram illustrating the removal at least a portion of the second and third epitaxial layers to form the channel region and source region in the process of manufacturing the first type vertical JFET. As illustrated in FIG. 5, at least a portion of second GaN epitaxial layer 301, third GaN epitaxial layers 401, and InGaN layer 420 are removed to form the channel region 501 and source region 550 respectively. Source region 550 includes a portion of third GaN layer 502 and InGaN layer 520. The removal can be performed by a controlled etch using an etch mask (not shown but having the dimensions of the source region 550) designed to stop at approximately the interface between the second GaN epitaxial layer 301 and the first GaN epitaxial layer 201. Due to the similarities between the first and second GaN epitaxial layers 201, 301, however, the etch may penetrate portions of the first GaN epitaxial layer 201 and/or fail to remove portions of the second GaN epitaxial layer 301 with negligible impact to the performance of the vertical JFET 100. Inductively-coupled plasma (ICP) etching and/or other common GaN etching processes can be used.

Depending on the processes used to form the channel region 501, the features of the resulting sidewalls 503 of the channel region 501 can vary. In some embodiments, the sidewall 503 can be vertical. In other embodiments, an outside angle 504 between the sidewall 503 and an upper surface 505 of the first GaN epitaxial layer 201 or other layer exposed by the removal process can be greater than 90 degrees, in which case the cross-sectional profile of the channel region 501 can be trapezoidal, as shown in FIG. 5. An outside angle 504 of greater than 90 degrees can facilitate deposition and/or regrowth of subsequent layers and can help improve performance by enabling better control of the electric field near the location where the sidewall 503 and upper surface 505 meet. In some embodiments, the removal profile (e.g., the etch profile) can produce a reentrant profile. One of ordinary skill in the art would recognize many variations, modifications, and alternatives.

The width 506 of channel region 501 (measured at the bottom of the channel) can vary, depending on numerous factors such as desired functionality of the vertical JFET 100, dopant concentrations of channel region 501, as well as other factors. For example, for a normally-off vertical JFET in which the channel region 501 has a dopant concentration between $1\times10^{14}$ cm$^{-3}$ and $1\times10^{17}$ cm$^{-3}$, the width 506 of the channel region 501 can be between 0.5 µm and 10 µm. In other embodiments, the width 506 of the channel region 501 can be less than 5 µm, less than 3 µm, or the like. For a normally-on vertical JFET, the width 506 of the channel region 501 can be greater.

Figure 6:
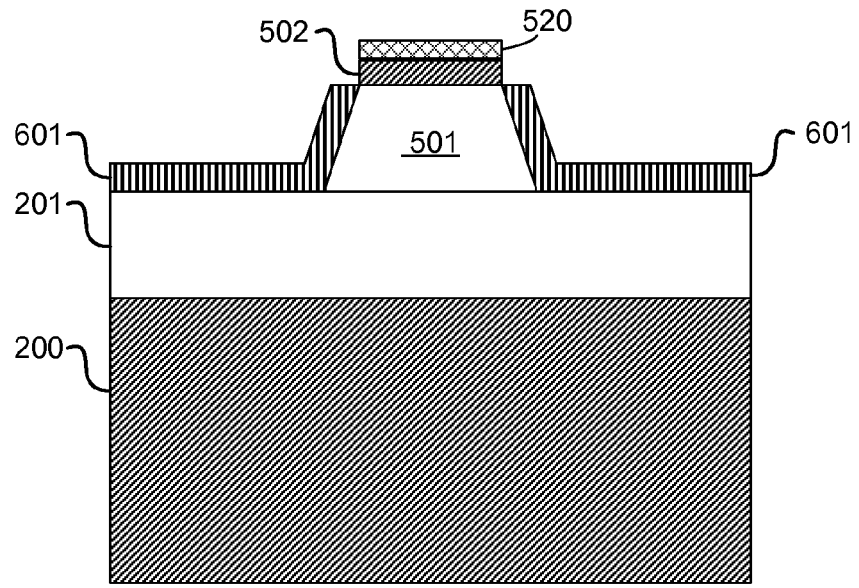

FIG. 6 illustrates the formation of a fourth GaN epitaxial layer 601. The fourth GaN epitaxial layer 601, which forms gate portions of the vertical JFET 100, has a conductivity type different than the channel region 501. For instance, if the channel region 501 is formed from an n-type GaN material, the fourth GaN epitaxial layer 601 will be formed from a p-type GaN material, and vice versa. In some embodiments, the layer 601 used to form the gate region is a continuous regrowth over portions of the device with other regions characterized by reduced or no growth as a result of the presence of a regrowth mask (not shown). As illustrated in FIG. 6, the source region 502 is protected during regrowth. In other embodiments, the regrowth is continuous over the entire substrate and then portions of the regrown layer are removed to expose the source region 502. One of ordinary skill in the art would recognize many variations, modifications, and alternatives.

The thickness of the fourth GaN epitaxial layer 601 can vary, depending on the process used to form the layer and the device design. In some embodiments, the thickness of the fourth GaN epitaxial layer 601 is between 0.1 µm and 5 µm. In other embodiments, the thickness of the fourth GaN epitaxial layer 601 is between 0.2 µm and 1 µm.

The fourth GaN epitaxial layer 601 can be highly doped, for example in a range from about $5\times10^7$ cm$^{-3}$ to about $1\times10^{20}$ cm$^{-3}$. Additionally, as with other epitaxial layers, the dopant concentration of the fourth GaN epitaxial layer 601 can be uniform or non-uniform as a function of thickness. In some embodiments, the dopant concentration increases with thickness, such that the dopant concentration is relatively low near the first GaN epitaxial layer 201 and channel region 501 and increases as the distance from the first GaN epitaxial layer 201 and channel region 501 increases. Such embodiments provide higher dopant concentrations at the top of the fourth GaN epitaxial layer 601 where metal contacts can be subsequently formed.

One method of forming the fourth GaN epitaxial layer 601, and other layers described herein, can be through a regrowth process that uses an in-situ etch and diffusion preparation processes. These preparation processes are described in U.S. patent application Ser. No. 13/198,666, filed on Aug. 4, 2011.

Figure 7:
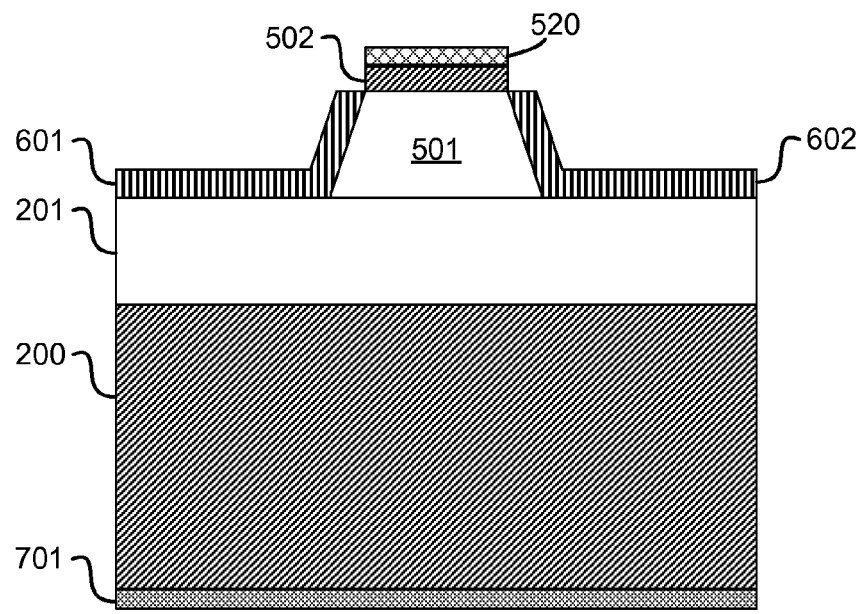

FIG. 7 illustrates the formation of a metallic structure 701 below the GaN substrate 200. The metallic structure 701 can be one or more layers of ohmic metal that serve as a contact for the drain of the vertical JFET 100. For example, the metallic structure 701 can comprise a titanium-aluminum (Ti/Al) ohmic metal. Other metals and/or alloys can be used including, but not limited to, aluminum, nickel, gold, combinations thereof, or the like. In some embodiments, an outermost metal of the metallic structure 701 can include gold, tantalum, tungsten, palladium, silver, or aluminum, combinations thereof, and the like. The metallic structure 701 can be formed using any of a variety of methods such as sputtering, evaporation, or the like.

Figure 8:
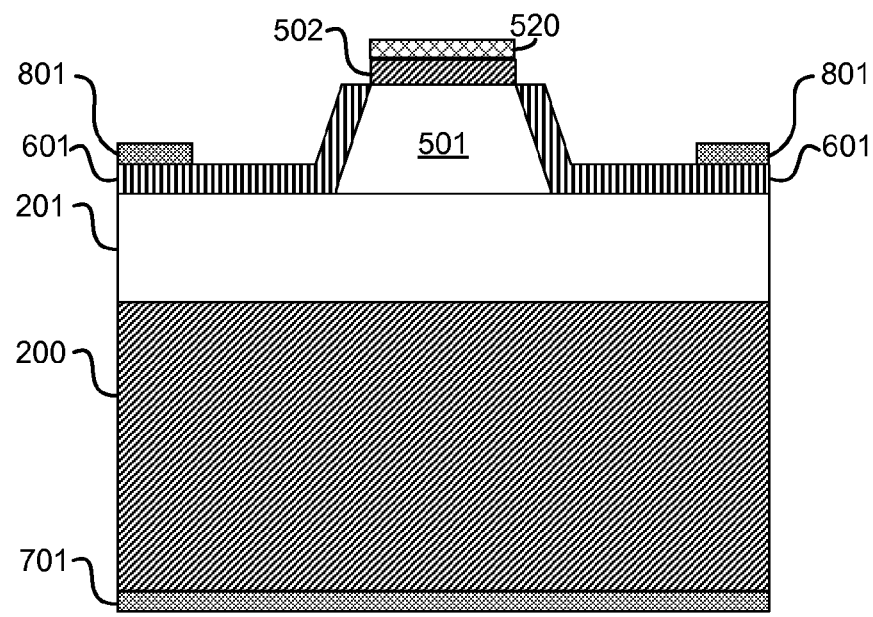

FIG. 8 illustrates the formation of additional metallic structures 801 on the fourth GaN epitaxial layer 601. The additional metallic structures 801 can be one or more layers of ohmic metal. The additional metallic structures 801 are formed on the fourth GaN epitaxial layer 601 to serve as the gate contacts of the vertical JFET 100. The additional metallic structures 801 can be formed using a variety of techniques, including lift-off and/or deposition with subsequent etching, which can vary depending on the metals used. The metals used to form metallic structures 801 can include Titanium, Aluminum, Platinum, Palladium, Nickel, or combinations thereof depending on whether an n-type contact or a p-type contact is desired. In some embodiments, another metallic structure may be formed overlying metallic structure 801 as described below. In some embodiments, metals used for an n-ohmic contact include Titanium, Aluminum, and the like. In some embodiments, metals used for p-ohmic contacts include Palladium, Platinum, Nickel, and the like. In some embodiments, metals used for an n-Schottky contact include Palladium, Platinum, Nickel, and the like.

Figure 9:
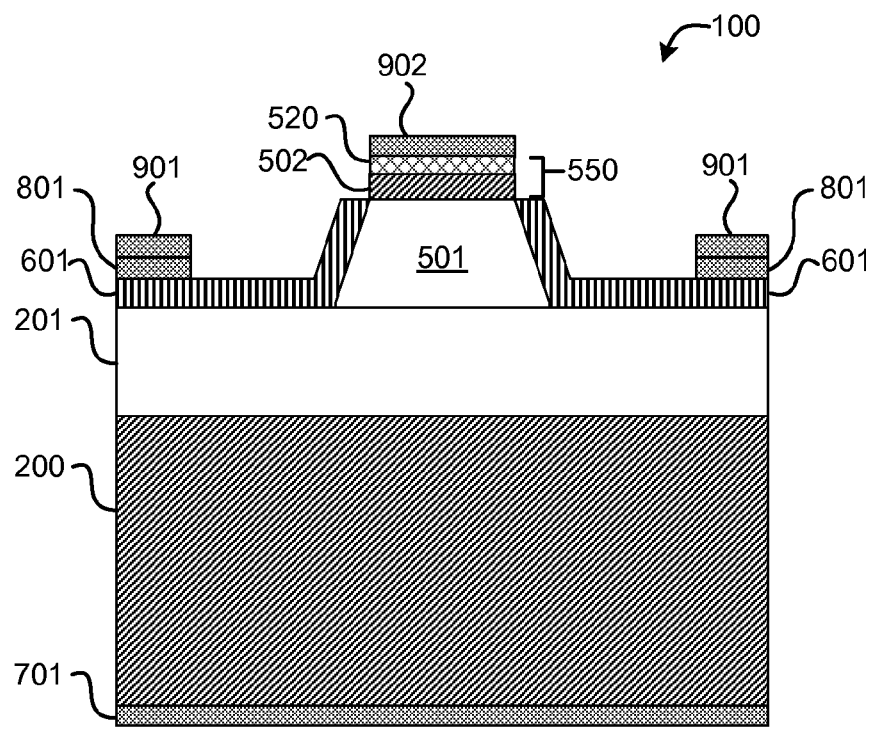

FIG. 9 illustrates the formation of further metallic structures 901, 902 on the additional metallic structures 801 and the source region 550, respectively. These further metallic structures 901, 902 can be formed using the same techniques used to form the additional metallic structures 801 of FIG. 8. Metallic structure 901 can include Nickel, Gold, Aluminum, or the like depending on the purpose of metallic structure 901. In some embodiments, metallic structure 901 may be used for wire bonding, as barrier metal, etc. Metallic structure 902 formed on the source region 550 can serve as a source contact for the vertical JFET 100. Similar to metallic structures 801, the choice of metals for metallic structure 902 may depend on whether an n-type contact or a p-type contact is to be formed over source region 550. In some embodiments, an additional metal layer (not shown) may be disposed over metallic structure 902 and may be similar to metallic structure 901.

Figure 15:
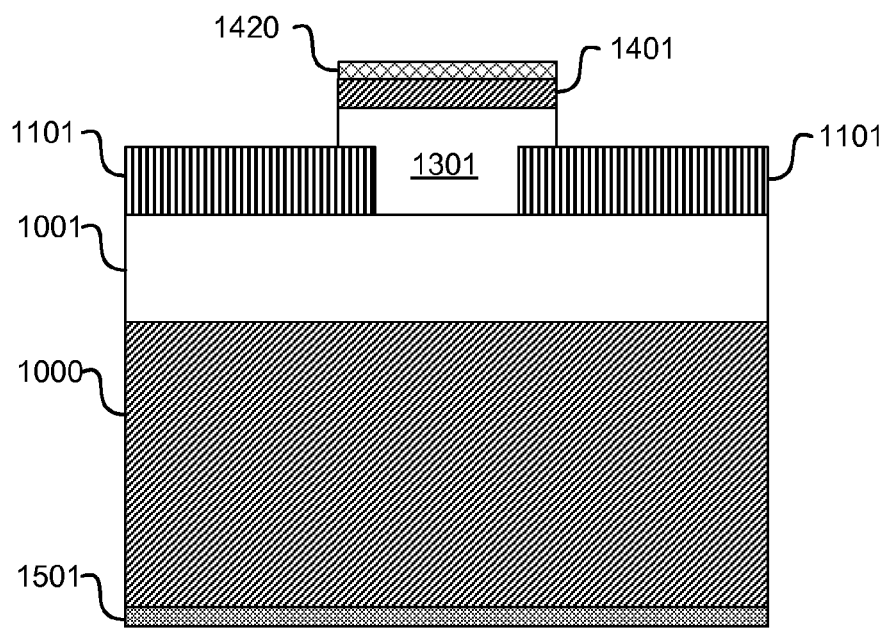
Figure 16:
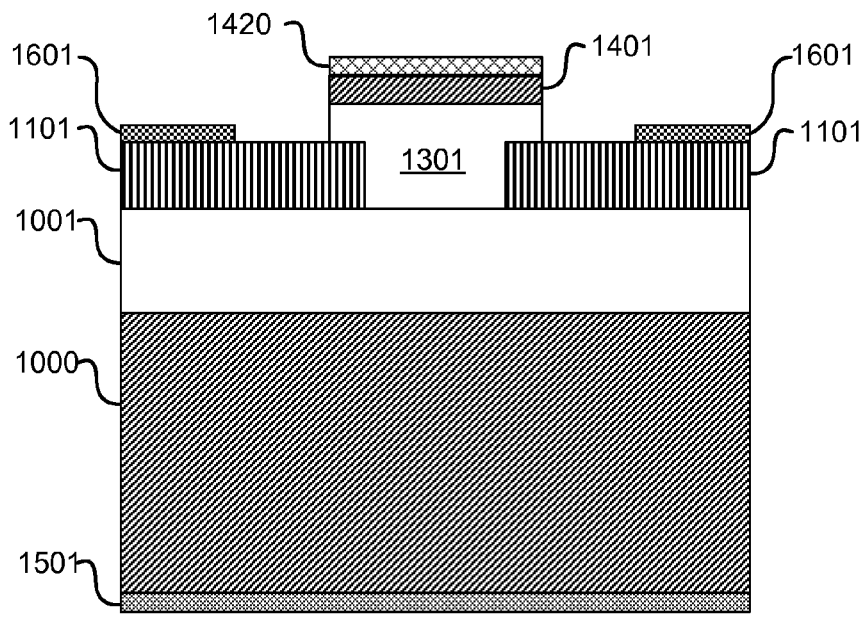
Figure 17:
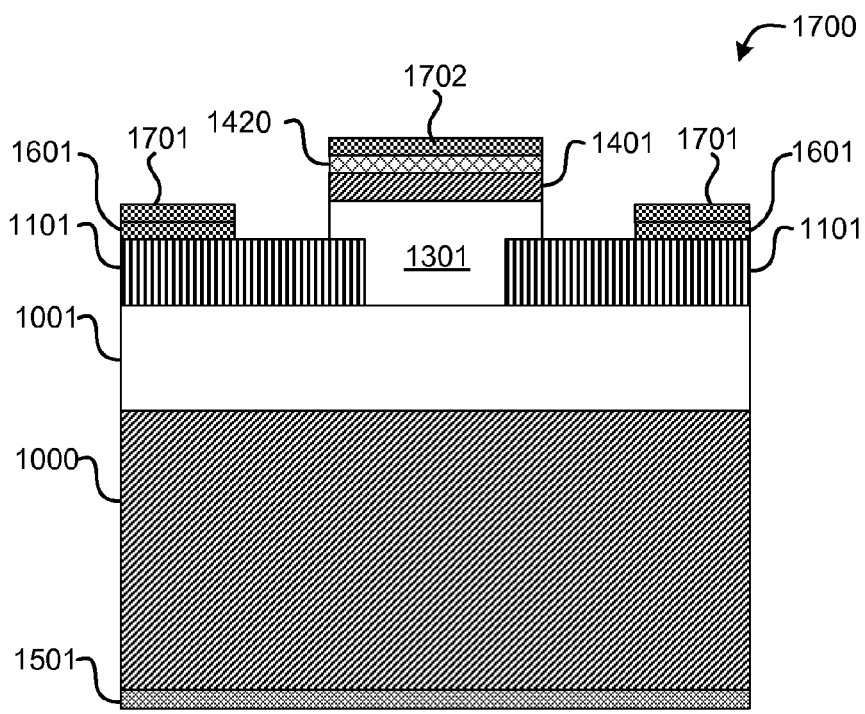

FIGS. 10-17 illustrate a process for creating a second type of vertical JFET 1700 illustrated in FIG. 17 that includes a channel fabricated using a regrowth process. Dopant concentrations, thicknesses, and other features of the second type of vertical JFET can be similar to the corresponding features of the first type of vertical JFET 100 discussed in relation to FIGS. 2-9. Thus, structures illustrated in FIGS. 10-17 including layers and metals can share similarities to structures in FIGS. 2-9. One of ordinary skill in the art would recognize many variations, modifications, and alternatives.

Figure 10:
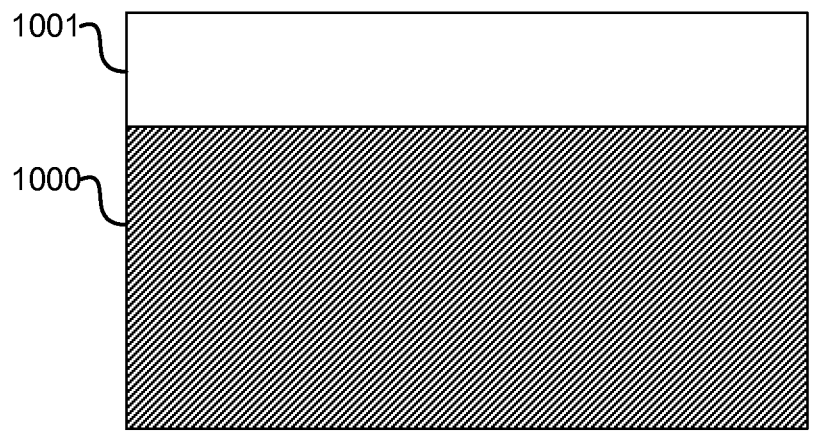
FIGS. 10-17 are simplified cross-sectional diagrams illustrating fabrication of a vertical JFET according to another embodiment of the present invention.

FIG. 10 is a simplified cross-sectional diagram illustrating the formation of a first GaN epitaxial layer 1001 on a GaN substrate 1000 to form a drift region of the vertical JFET with regrown channel 1700. The first GaN epitaxial layer 1001 can be low doped, and the GaN substrate 1000 can be a GaN bulk or pseudo-bulk substrate with higher dopant concentration. Physical features of the first GaN epitaxial layer 1001 and the GaN substrate 1000 can be similar to those of the first GaN epitaxial layer 201 and the GaN substrate 200 of FIG. 2, respectively.

Figure 11:

FIG. 11 illustrates the formation of a second GaN epitaxial layer 1101 above the first GaN epitaxial layer 1001. The second GaN epitaxial layer 1101, which eventually can comprise the gate of the vertical JFET 1700, can be a highly-doped epitaxial layer of a different conductivity type from the first GaN epitaxial layer 1001. In an n-channel vertical JFET, for example, the second GaN epitaxial layer 1101 can comprise a p+ GaN epitaxial layer, and the first GaN epitaxial layer 1001 can include an n-GaN epitaxial layer. Dopant concentration, dopant uniformity, and layer thickness can be similar to the third GaN epitaxial layer 401 described in relation to FIG. 4 above.

Figure 12:
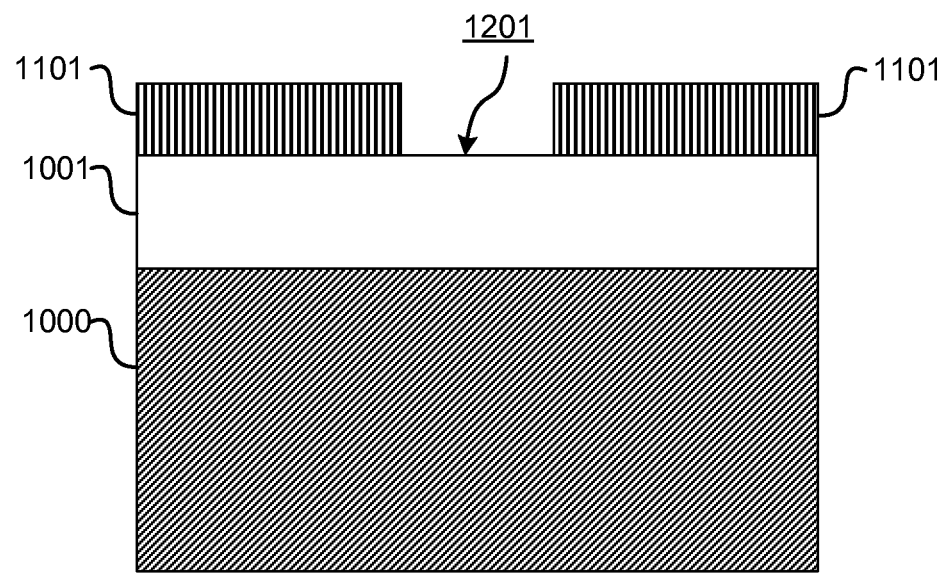

FIG. 12 illustrates the removal of at least a portion of the second GaN epitaxial layer 1101 to expose a surface 1201 of the first GaN epitaxial layer 1001. This removal can be configured to stop at the surface of the first GaN epitaxial layer 1001, although removal, such as etching, may penetrate a portion of the first GaN epitaxial layer 1001. ICP etching and/or other appropriate GaN etching processes can be used.

Because a channel region of the vertical JFET 1700 will be formed on the surface 1201 of the first GaN epitaxial layer 1001, the dimensions of the removed portion(s) of the second GaN epitaxial layer 1101 define the channel width of the vertical JFET 1700. As described earlier, channel width of the vertical JFET 1700 can vary, depending on various factors such as desired functionality of the vertical JFET 1700, dopant concentrations of the channel region, and the like. For example, a normally-off vertical JFET can have a channel width of less than 3 µm, less than 5 µm, or less than 10 µm, with some embodiments having a channel width between 0.5 µm and 3 µm. For a normally-on JFET, the channel width can be greater.

Figure 13:
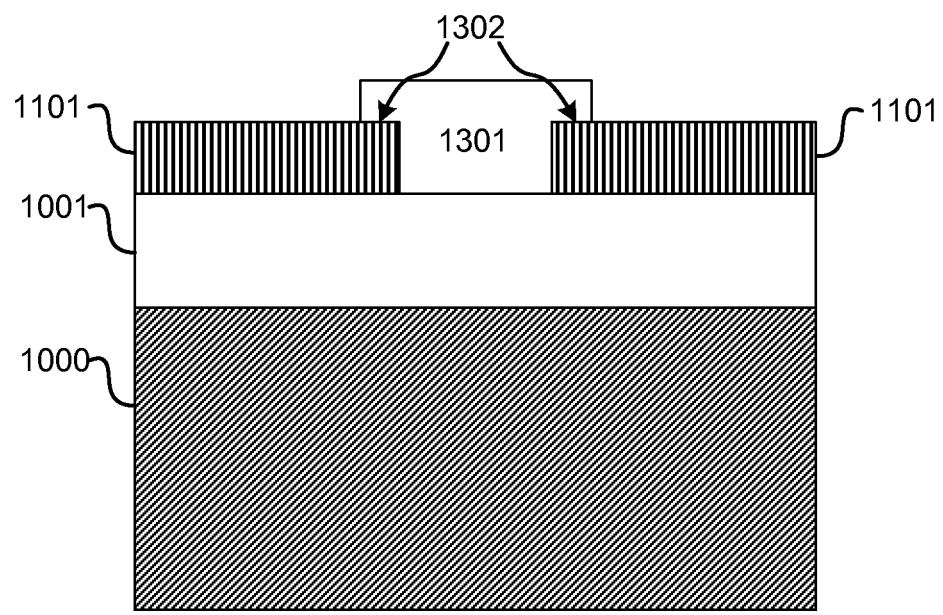

FIG. 13 illustrates the formation of a GaN channel region 1301, which is formed in the removed portion(s) of the second GaN epitaxial layer 1101. The GaN channel region 1301 can be formed by GaN selective regrowth on the exposed surface 1201 of the first GaN epitaxial layer 1001. Because the selective regrowth process can include lateral growth, the GaN channel region 1301 can extend over at least a portion of one or more upper surface(s) 1302 of the second GaN epitaxial layer 1101 if the thickness of the GaN channel region 1301 exceeds the thickness of the second GaN epitaxial layer 1101. Such lateral growth can be acceptable in many vertical JFET applications.

Figure 14:
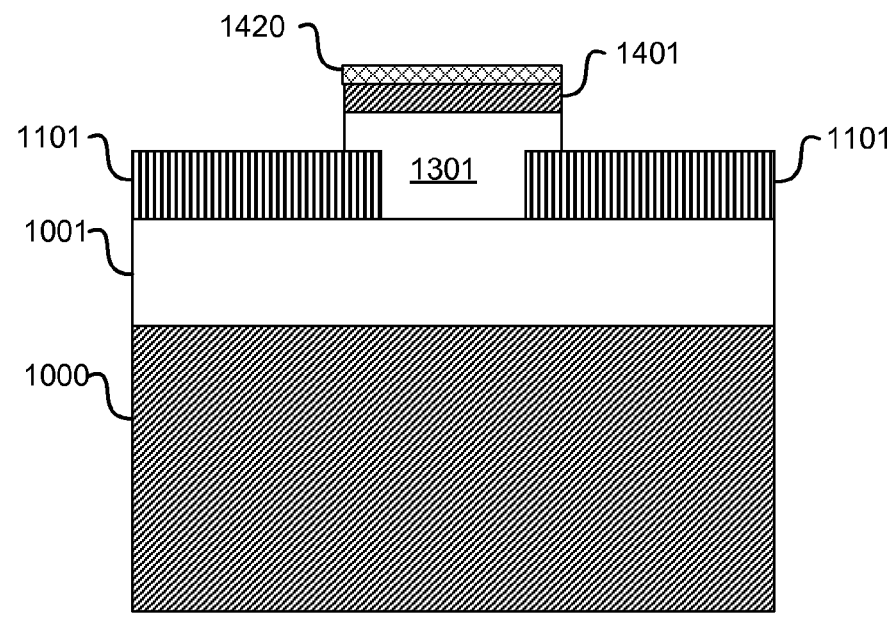

FIG. 14 illustrates the formation of a GaN epitaxial structure 1401 above the GaN channel region 1301 and an InGaN layer 1420 above GaN epitaxial structure 1401. The GaN epitaxial structure 1401 can be a highly doped epitaxial layer of the same conductivity type as the first GaN epitaxial layer 1001 and the GaN channel region 1301. InGaN layer 1420 can have the same conductivity as GaN epitaxial structure 1401. Together, GaN epitaxial structure 1401 and InGaN layer 1420 form a multilayered structure 1450, which eventually can comprise the source of the vertical JFET 1700. Dopant concentration, dopant uniformity, and layer thicknesses of GaN epitaxial structure 1401 and InGaN layer 1420 can be similar to the third GaN epitaxial layer 401 and InGaN layer 420, respectively as described in relation to FIG. 4 above.

FIG. 15 illustrates the formation of a metallic structure 1501 coupled with the GaN substrate 1000. The metallic structure 1501 provides a gate contact for the vertical JFET 1700. The formation and composition of the metallic structure 1501 can be similar to the metallic structure 701 described in relation to FIG. 7.

FIG. 16 illustrates the formation of additional metallic structures 1601 on the second GaN epitaxial layer 1101. The additional metallic structures 1601 serve as gate contacts for the vertical JFET 1700, and the formation and composition of the additional metallic structures 1601 depends on whether the underlying GaN layer has an n-type conductivity or p-type conductivity and can be similar to the additional metallic structures 801 as described above in relation to FIG. 8.

Finally, referring to FIG. 17, the formation of further metallic structures 1701, 1702 on the additional metallic structures 1601 and InGaN layer 1420, respectively is illustrated. These further metallic structures 1701, 1702 can be formed using the same techniques used to form the additional metallic structures 1601 of FIG. 16, and also can comprise similar metals and/or alloys. Because additional metallic structures 1601 can sufficiently form contacts to the second GaN epitaxial layer 1101, the additional metallic structures 1601 can be omitted, if desired. The further metallic structure 1702 formed on InGaN layer 1420 can serve as a source contact for the vertical JFET 1700. Metallic structures 1601 and 1702 may include metals similar to metallic structures 801 of FIG. 8 described above and may depend on whether an n-type or a p-type contact is desired. Metallic structures 1701 may be similar to metallic structure 901 of FIG. 9 described above. In some embodiments, another metal layer (not shown) may be formed over metallic structure 1702. The other metal layer may be similar to metallic structure 1701.

Although similar to the first type of vertical JFET 100 shown in FIGS. 2-9, the second type of vertical JFET described in FIGS. 10-17 does feature several differences in design. For example, vertical JFET 1700 includes gate material (second GaN epitaxial layer 1101) that is deposited during the initial epitaxial growth, not regrown as provided for the vertical JFET 100, providing for fewer defects at the interface of the p-n junction between the gate material and the drift region (first GaN epitaxial layer 1001). In some embodiments, defects at the interface of the GaN channel region 1301 and the drift region have a reduced effect on the performance of the resulting vertical JFET 1700 because the interface does not form a high quality p-n junction.

Figure 18:
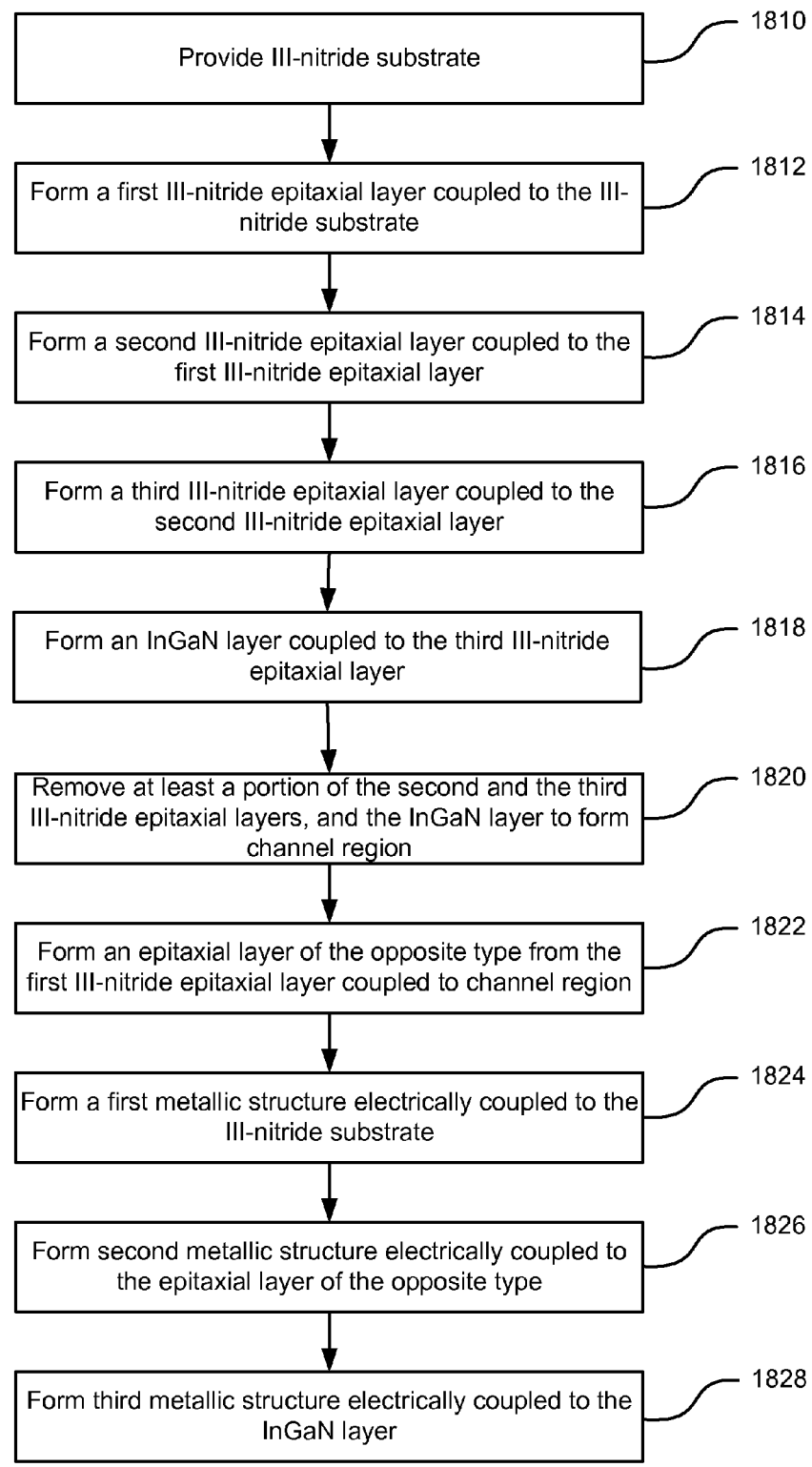
FIG. 18 is a simplified flowchart illustrating a method of fabricating a vertical power device with a regrown gate region according to an embodiment of the present invention.

FIG. 18 is a simplified flowchart illustrating a method of fabricating a vertical JFET with a regrown gate region according to an embodiment of the present invention. In some embodiments, the vertical JFET is referred to as a controlled switching device. Referring to FIG. 18, a III-nitride substrate is provided (1810). In an embodiment, the III-nitride is an n-type GaN substrate. The method also includes forming a first III-nitride epitaxial layer (e.g., an n-type GaN epitaxial layer) coupled to the III-nitride substrate (1812). The first III-nitride epitaxial layer is characterized by a first dopant concentration, for example n-type doping. Using the homoepitaxy techniques described herein, the thickness of the first III-nitride epitaxial layer can be thicker than available using conventional techniques, for example, between about 1 µm and about 100 µm, more particularly, between about 3 µm and 80 µm.

The method further includes forming a second III-nitride epitaxial layer (e.g., a GaN epitaxial layer) coupled to the first III-nitride epitaxial layer (1814). The second III-nitride epitaxial layer has a second dopant concentration of the same type and less than or equal to the first dopant concentration, for example, n-type doping with a doping concentration lower than the first epitaxial layer.

The method includes forming a third III-nitride epitaxial layer (e.g., a GaN layer) coupled to the second III-nitride epitaxial layer (1816). The third III-nitride epitaxial layer has a third dopant concentration of the same type and greater than the first dopant concentration, for example, an n-type layer with a higher doping concentration than the second epitaxial layer. The method further comprises forming an InGaN layer coupled to the third III-nitride epitaxial layer (1818). The InGaN layer has a dopant concentration of the same type as third III-nitride epitaxial layer. In some embodiments, the percentage of indium in the InGaN layer can vary between 5 and 90.

The method further includes removing at least a portion of the third III-nitride epitaxial layer, the InGaN layer, and at least a portion of the second III-nitride epitaxial layer to form a channel region of the second III-nitride epitaxial layer (1820). The removal process can include a masking an etching process that can include physical etching components as well as chemical etching components.

Additionally, the method includes forming an epitaxial layer of an opposite type from the first III-nitride epitaxial layer (e.g., a p-type GaN layer) coupled to the channel region (1822). This epitaxial layer forms a gate region at least fully or partially surrounding the channel region previously fabricated. A first metallic structure electrically coupled to the III-nitride substrate is formed (1824), a second metallic structure electrically coupled to the epitaxial layer of the opposite type is formed (1826), and a third metallic structure electrically coupled to the InGaN layer is formed (1828). As illustrated in FIG. 9, these metallic structures provide for electrical connectivity to the drain, source, and gate of the vertical JFET. The various epitaxial layers do not have to be uniform in dopant concentration as a function of thickness, but may utilize varying doping profiles as appropriate to the particular application.

It should be appreciated that the specific steps illustrated in FIG. 18 provide a particular method of fabricating a vertical JFET with a regrown gate region according to an embodiment of the present invention. Other sequences of steps may also be performed according to alternative embodiments. For example, alternative embodiments of the present invention may perform the steps outlined above in a different order. Moreover, the individual steps illustrated in FIG. 18 may include multiple sub-steps that may be performed in various sequences as appropriate to the individual step. Furthermore, additional steps may be added or removed depending on the particular applications. One of ordinary skill in the art would recognize many variations, modifications, and alternatives.

Figure 19:
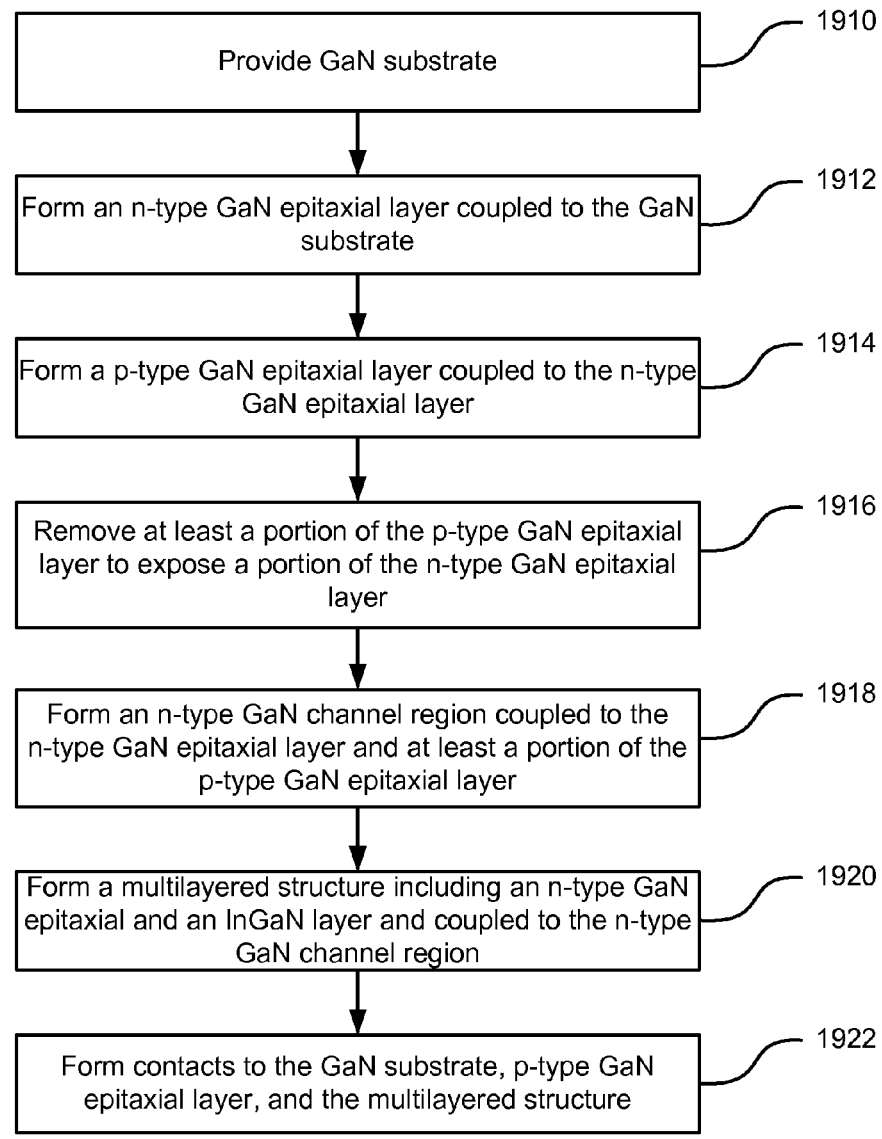
FIG. 19 is a simplified flowchart illustrating a method of fabricating a vertical power device with a regrown channel region according to an embodiment of the present invention.

FIG. 19 is a simplified flowchart illustrating a method of fabricating a vertical JFET with a regrown channel region according to an embodiment of the present invention. The method includes providing a gallium nitride (GaN) substrate (1910) and forming an n-type GaN epitaxial layer coupled to the GaN substrate (1912). The n-type GaN epitaxial layer is characterized by a first n-type dopant concentration and can have a thickness ranging from about 1 µm to about 100 µm. A variety of n-type dopants can be used including silicon or oxygen. The method also includes forming a p-type GaN epitaxial layer coupled to the n-type GaN epitaxial layer (1914). The p-type GaN epitaxial layer is characterized by a p-type dopant concentration.

The method further includes removing at least a portion of the p-type GaN epitaxial layer to expose a portion of the n-type GaN epitaxial layer (1916). The portion of the n-type GaN epitaxial layer can be an initial surface of the epitaxial layer or an interior portion of the epitaxial layer. Additionally, the method includes forming an n-type GaN channel region coupled to the n-type GaN epitaxial layer and at least a portion of the p-type GaN epitaxial layer (1918). In some embodiments, formation of the channel region utilizes a selective regrowth process in which the thickness of the n-type GaN channel region is greater than the thickness of the p-type GaN epitaxial layer and the regrowth includes lateral regrowth.

The method includes forming a multilayered structure including n-type GaN epitaxial structure and an InGaN layer coupled to the n-type GaN channel region (1920) and forming contacts to the GaN substrate, the p-type GaN epitaxial layer and the multilayered structure (1922). In some embodiments, the n-type GaN epitaxial layer is characterized by a first n-type dopant concentration and the n-type GaN epitaxial structure is characterized by a third n-type dopant concentration greater than the first n-type dopant concentration. In some specific embodiments, at least one of the first n-type dopant concentration, the second n-type dopant concentration, or the third n-type dopant concentration varies as a function of thickness.

It should be appreciated that the specific steps illustrated in FIG. 19 provide a particular method of fabricating a vertical JFET with a regrown channel region according to an embodiment of the present invention. Other sequences of steps may also be performed according to alternative embodiments. For example, alternative embodiments of the present invention may perform the steps outlined above in a different order. Moreover, the individual steps illustrated in FIG. 19 may include multiple sub-steps that may be performed in various sequences as appropriate to the individual step. Furthermore, additional steps may be added or removed depending on the particular applications. One of ordinary skill in the art would recognize many variations, modifications, and alternatives.

There are many advantages of using the materials and processes described herein over conventional techniques. Conventionally, GaN layers are grown on Sapphire or SiC substrates. These substrates have higher inherent defect densities, e.g., in the order of $10^7$ to $10^9$ defects/cm$^2$. In addition, the GaN material and the Sapphire/SiC substrate have different lattice structures. Therefore, when a GaN material is deposited on these conventional substrates, the inherent higher defect densities coupled to the lattice distortions due to the different lattice structures result in higher strain on the individual layers. The higher strain further causes surface pitting of the GaN layer on which a contact is then formed. The contact this formed is of a lower quality.

In contrast, embodiments of the present invention provide for a multilayer structure where a GaN-based layer is deposited on a GaN substrate. The GaN substrate itself has low defect density, e.g. in the order of $10^4$ or $10^5$ defects/cm$^2$. When a GaN-based layer, e.g., InGaN, is formed over a low defect density GaN substrate, the lattice distortions are minimized or eliminated which greatly reduces the overall strain on the layers. This allows for a large variation in the Indium percentage to be included in the InGaN layer, e.g., between 5% and 90%. As described above, the Indium in the InGaN layer can be varied to make the source region to have less pitting and surface degradation resulting in a more homogenous and high quality source contact.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A power device comprising:
   a drain comprising a first III-nitride material;
   a drain contact electrically coupled to the drain;
   a drift region comprising a second III-nitride material coupled to the drain and disposed adjacent to the drain along a vertical direction;
   a channel region comprising a third III-nitride material coupled to the drift region;
   a gate region at least partially surrounding the channel region;
   a gate contact electrically coupled to the gate region;
   a source coupled to the channel region, wherein the source comprises (i) a gallium nitride layer and (ii) a crystalline indium gallium nitride (InGaN) layer coupled to the gallium nitride layer; and
   a source contact electrically coupled to the source;
   wherein the channel region is disposed between the drain and the source along the vertical direction such that current flow during operation of the power device is along the vertical direction.

2. The power device of claim 1 wherein the percentage of indium in the InGaN layer is between 20% and 90%.

3. The power device of claim 2 wherein the percentage of indium in the InGaN layer is between 30% and 90%.

4. The power device of claim 3 wherein the percentage of indium in the InGaN layer is between 50% and 90%.

5. The power device of claim 1 wherein the gallium nitride layer has an n-type conductivity.

6. The power device of claim 1 wherein the gate region has a first conductivity opposite to a second conductivity of the first III-nitride material.

7. The power device of claim 6 wherein the first conductivity is p-type.

* * * * *

UNITED STATES PATENT AND TRADEMARK OFFICE
CERTIFICATE OF CORRECTION

PATENT NO.        : 9,006,800 B2
APPLICATION NO.   : 13/326192
DATED             : April 14, 2015
INVENTOR(S)       : Linda Romano et al.

Page 1 of 1

It is certified that error appears in the above-identified patent and that said Letters Patent is hereby corrected as shown below:

In the Specification

In column 8, line 49, delete "$10^7$" and insert -- $10^{17}$ --, therefor.

Signed and Sealed this
Eighth Day of September, 2015

Michelle K. Lee
*Director of the United States Patent and Trademark Office*